(12) United States Patent
Kubota et al.

(10) Patent No.: US 12,310,155 B2
(45) Date of Patent: May 20, 2025

(54) PHOSPHOR PLATE AND LIGHT EMITTING DEVICE

(71) Applicant: DENKA COMPANY LIMITED, Tokyo (JP)

(72) Inventors: Yuki Kubota, Tokyo (JP); Taiyo Yamaura, Tokyo (JP); Kazuhiro Ito, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 512 days.

(21) Appl. No.: 17/800,761

(22) PCT Filed: Feb. 12, 2021

(86) PCT No.: PCT/JP2021/005179
§ 371 (c)(1),
(2) Date: Aug. 18, 2022

(87) PCT Pub. No.: WO2021/186970
PCT Pub. Date: Sep. 23, 2021

(65) Prior Publication Data
US 2023/0107808 A1    Apr. 6, 2023

(30) Foreign Application Priority Data

Mar. 18, 2020   (JP) ................................. 2020-047298

(51) Int. Cl.
*H10H 20/851* (2025.01)
*H10H 20/825* (2025.01)

(52) U.S. Cl.
CPC ...... *H10H 20/8512* (2025.01); *H10H 20/825* (2025.01); *H10H 20/8514* (2025.01)

(58) Field of Classification Search
CPC .......... H10H 20/8512; H10H 20/8514; H10H 20/825
See application file for complete search history.

(56) References Cited

U.S. PATENT DOCUMENTS 7,443,094 B2    10/2008    Sakane et al.
7,445,730 B2    11/2008    Nagatomi et al.
(Continued)

FOREIGN PATENT DOCUMENTS

CN    101151346 A    3/2008
CN    101831294 A    9/2010
(Continued)

OTHER PUBLICATIONS

Mar. 28, 2024 Office Action issued in Taiwanese Patent Application No. 110105586.
(Continued)

*Primary Examiner* — Mark W Tornow
(74) *Attorney, Agent, or Firm* — Oliff PLC

(57) ABSTRACT

A phosphor plate includes a plate-like composite including a base material and a phosphor contained in the base material, in which the base material contains spinel, the phosphor includes a phosphor containing a Si element, and in an X-ray diffraction pattern of the phosphor plate using a Cu-Kα ray, in a case in which peak intensity corresponding to the spinel having a diffraction angle 2θ in a range of 36.0° or more and 37.4° or less is set to 1, total intensity of peaks having a diffraction angle 2θ in a range of 32.5° or more and 34.5° or less satisfies 0.5 or less.

11 Claims, 3 Drawing Sheets

(56) References Cited

U.S. PATENT DOCUMENTS

| | | | |
|---|---|---|---|
| 8,048,338 | B2 | 11/2011 | Nagatomi et al. |
| 9,570,655 | B2 | 2/2017 | Yoshimura et al. |
| 9,644,801 | B2 | 5/2017 | Kishimoto et al. |
| 9,711,686 | B2 | 7/2017 | Yoshimura et al. |
| 11,041,606 | B1 | 6/2021 | Furuyama |
| 11,387,390 | B2 | 7/2022 | Fukui et al. |
| 2006/0220047 | A1 | 10/2006 | Nagatomi et al. |
| 2006/0220520 | A1 | 10/2006 | Sakane et al. |
| 2009/0026915 | A1 | 1/2009 | Nagatomi et al. |
| 2013/0193837 | A1* | 8/2013 | Ohno ............... B32B 15/00 428/690 |
| 2013/0285104 | A1 | 10/2013 | Yoshimura et al. |
| 2014/0168942 | A1 | 6/2014 | Kishimoto et al. |
| 2015/0225281 | A1* | 8/2015 | Park ................ H05B 33/00 313/503 |
| 2016/0204311 | A1 | 7/2016 | Yoshimura et al. |
| 2017/0284633 | A1 | 10/2017 | Chiu et al. |
| 2019/0165220 | A1 | 5/2019 | Fukui et al. |
| 2021/0172583 | A1 | 6/2021 | Furuyama |
| 2022/0350061 | A1* | 11/2022 | Yamaura ............ C09K 11/02 |
| 2022/0399480 | A1* | 12/2022 | Yamaura ........... C09K 11/676 |

FOREIGN PATENT DOCUMENTS

| | | |
|---|---|---|
| CN | 103328608 A | 9/2013 |
| CN | 114599764 A | 6/2022 |
| JP | 2015-199640 A | 11/2015 |
| JP | 2019-135543 A | 8/2019 |
| KR | 10-2013-0045778 A | 5/2013 |
| TW | 201733940 A | 10/2017 |
| WO | 2013/018494 A1 | 2/2013 |
| WO | 2019/116916 A1 | 6/2019 |

OTHER PUBLICATIONS

Oct. 28, 2023 Office Action issued in Chinese Patent Application No. 202180015948.2.
May 11, 2021 International Search Report issued in International Patent Application No. PCT/JP2021/005179.
Sep. 24, 2024 Office Action issued in Korean Patent Application No. 10-2022-7028347.
Duan et al., "Synthesis of MgAl2O4—SiAlON Composite Powders by Carbothermal Nitritdation of Forsterite and Alumina", Advanced Material Research, 2013, p. 2388-2391, vol. 634-638.

* cited by examiner

100

PHOSPHOR PLATE AND LIGHT EMITTING DEVICE

TECHNICAL FIELD

The present invention relates to a phosphor plate and a light emitting device.

BACKGROUND ART

As a wavelength conversion member, a material in which an inorganic phosphor is dispersed in a sealing resin has been used so far. However, since there has been a problem that the resin is deteriorated by heat or light generated by a light source using an LED in a case in which the resin is used as the base material, so that the examination has also been conducted on the wavelength conversion member in which the base material is an inorganic substance. Patent Document 1 discloses a wavelength conversion member in which an inorganic phosphor is dispersed in glass which is the base material (claim 1 of Patent Document 1). According to Patent Document 1, a phosphor plate is also disclosed in which a shape of the wavelength conversion member is not limited and is plate-like (paragraph 0054).

RELATED DOCUMENT

Patent Document

[Patent Document 1] Japanese Unexamined Patent Publication No. 2015-199640

SUMMARY OF THE INVENTION

Technical Problem

However, as a result of the examination by the present inventors, it has been found that there is room for improvement in terms of light emission intensity in the phosphor plate disclosed in Patent Document 1 described above.

Solution to Problem

As a result of the examination, the present inventors have found that excessive scattering of light in the phosphor plate is suppressed by containing relatively transparent spinel in an inorganic base material, so that the light emission intensity of the phosphor plate can be improved.

As a result of further examination, the present inventors have found that, in a case in which the phosphor containing a Si element is used as the inorganic phosphor described above, there is a risk that the light emission intensity is decreased in the phosphor plate containing the spinel.

As a result of further diligent research based on such findings, the present inventors have found that, in an X-ray diffraction pattern of the phosphor plate, an optical characteristic can be stably evaluated by using a ratio between intensity of a specific peak attributed to the spinel and total peak intensity of peaks present within a predetermined range of $2\theta$ as an index, and the light emission intensity of the phosphor plate is improved by setting an upper limit of such a peak intensity ratio to a predetermined value or less, and have completed the present invention.

According to the present invention, provided is a phosphor plate including a plate-like composite including a base material and a phosphor contained in the base material, in which the base material contains spinel, the phosphor includes a phosphor containing a Si element, and in an X-ray diffraction pattern of the phosphor plate measured using a Cu-K$\alpha$ ray, in a case in which peak intensity corresponding to the spinel having a diffraction angle $2\theta$ in a range of 36.0° or more and 37.4° or less is set to 1, total intensity of peaks having a diffraction angle $2\theta$ in a range of 32.5° or more and 34.5° or less satisfies 0.5 or less.

In addition, according to the present invention, provided is a light emitting device including a group III nitride semiconductor light emitting element, and the phosphor plate described above provided over one surface of the group III nitride semiconductor light emitting element.

Advantageous Effects of Invention

The present invention is to provide a phosphor plate having excellent light emission intensity and a light emitting device using the same.

DESCRIPTION OF EMBODIMENTS

Figure 1:
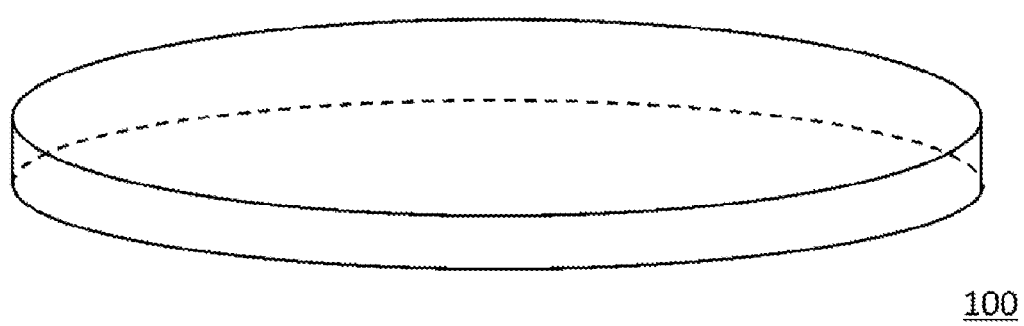
FIG. 1 is a schematic view showing an example of a configuration of a phosphor plate according to the present embodiment.

In the following, an embodiment of the present invention will be described below with reference to the drawings. Note that, in all drawings, similar components are designated by the same reference numerals, and the description thereof will not be repeated. In addition, the drawings are schematic views and do not match an actual dimensional ratio.

The phosphor plate according to the present embodiment will be outlined.

An outline of a phosphor plate according to the present embodiment will be described.

The phosphor plate according to the present embodiment includes a plate-like composite (plate-like member) including a base material containing spinel and a phosphor having a Si element present in the base material.

The phosphor plate including an $\alpha$-type sialon phosphor as the phosphor containing the Si element can function as a wavelength converter that converts irradiated blue light into orange light and emits the converted orange light.

The phosphor plate is configured such that, in an X-ray diffraction pattern measured by the following procedure, in a case in which peak intensity corresponding to spinel having a diffraction angle $2\theta$ in a range of 36.0° or more and 37.4° or less is set to 1, total intensity of peaks having the diffraction angle $2\theta$ in a range of 32.5° or more and 34.5° or less satisfies 0.5 or less.

(Measurement Method of X-Ray Diffraction Pattern)

A diffraction pattern of the phosphor plate is measured by using an X-ray diffraction device based on the following measurement conditions.

The phosphor plate, which is a measurement target, may have a thickness of about 0.18 to 0.22 mm.

(Measurement Conditions)

X-ray source: Cu-K$\alpha$ ray ($\lambda$=1.54184 Å)

Output setting: 40 kV·40 mA

Optical condition at the time of measurement: divergence slit=⅔°
Scattering slit=8 mm
Light receiving slit=open
Position of diffraction peak=2θ (diffraction angle)
Measurement range: 2θ=20° to 70°
Scan speed: 2 degrees (2θ)/sec, continuous scan
Scanning axis: 2θ/θ
Sample preparation: the plate-like phosphor plate is placed on a sample holder.

The peak intensity is a value obtained by performing background correction.

According to the findings of the present inventors, it has been seen that the optical characteristic of the phosphor plate including the phosphor containing the Si element can be evaluated by using a ratio between the intensity ($I_\alpha$) of the peak attributed to the spinel having the diffraction angle 2θ in the range of 36.0° or more and 37.4° or less and the total intensity ($I_\beta$) of peaks present in a predetermined range of 2θ as an index, and it has been found that, as a result of further examination of the range of 2θ corresponding to $I_\beta$, the optical characteristic of the phosphor plate can be stably evaluated by using the total intensity of peaks having the diffraction angle 2θ is in the range of 32.5° or more and 34.5° or less as $I_{\beta 1}$.

Further, it has been found that the light emission intensity of the phosphor plate is improved by setting an upper limit of the index $I_{\beta 1}/I_\alpha$ found in this way to a specific value or less.

In the phosphor plate according to the present invention, a maximum peak having the diffraction angle 2θ in the range of 36.0° or more and 37.4° or less is defined as a peak derived from spinel.

The peak having the diffraction angle 2θ in the range of 32.5° or more and 34.5° or less preferably includes a peak attributed to α-type sialon, and may include other peaks attributed to β-type sialon.

In a case in which the peak intensity attributed to the spinel having the diffraction angle 2θ in the range of 36.0° or more and 37.4° or less is set to 1, an upper limit of the total intensity $I_{\beta 1}$ of the peaks having the diffraction angle 2θ in the range of 32.5° or more and 34.5° or less is 0.5 or less, and preferably 0.3 or less. As a result, it is possible to improve the light emission intensity of the phosphor plate.

On the other hand, a lower limit of the total intensity $I_{\beta 1}$ described above is not particularly limited, but in a case in which the phosphor containing the Si element contains the α-type sialon phosphor, the lower limit is, for example, 0.005 or more, and preferably 0.01 or more. As a result, it is possible to improve the light emission intensity of the phosphor plate.

In a case in which the peak intensity attributed to the spinel having the diffraction angle 2θ in the range of 36.0° or more and 37.4° or less is set to 1, an upper limit of the total intensity $I_{\beta 2}$ of the peaks having the diffraction angle 2θ in the range of 60.2° or more and 62.0° or less may be, for example, 0.2 or less, or preferably 0.1 or less. As a result, it is possible to improve the light emission intensity of the phosphor plate.

On the other hand, a lower limit of the total intensity $I_{\beta 2}$ is, for example, 0.005 or more, preferably 0.01 or more, and more preferably 0.02 or more. As a result, it is possible to improve the light emission intensity of the phosphor plate.

In a case in which the peak intensity attributed to the spinel having the diffraction angle 2θ in the range of 36.0° or more and 37.4° or less is set to 1, a lower limit of the total intensity $I_{\beta 3}$ of the peaks having the diffraction angle 2θ in the range of 29.0° or more and 31.0° or less is 0.01 or less, preferably 0.03 or less, and more preferably 0.05 or more. As a result, it is possible to improve the light emission intensity of the phosphor plate.

On the other hand, an upper limit of the total intensity $I_{\beta 3}$ described above is not particularly limited, but may be, for example, 0.5 or less, or 0.3 or less. As a result, it is possible to enhance the manufacturing stability of the phosphor plate.

It is preferable that the peak having the diffraction angle 2θ in the range of 60.2° or more and 62.0° or less or the peak having the diffraction angle 2θ in the range of 29.0° or more and 31.0° or less include the peak attributed to α-type sialon.

In the present embodiment, for example, the total intensities $I_{\beta 1}$, $I_{\beta 2}$, and $I_{\beta 3}$ described above can be controlled by appropriately selecting a type or a blending amount of each component contained in the phosphor in the phosphor plate, a preparation method of the phosphor or the phosphor plate, and the like. Among these, for example, appropriately adjusting a ratio of Mg/Al in the spinel raw material powder is used as an element for setting the total intensities $I_{\beta 1}$, $I_{\beta 2}$, and $I_{\beta 3}$ described above to a desired numerical range.

In a case in which the phosphor plate described above is irradiated with blue light having a wavelength of 455 nm, it is preferable that the peak wavelength of the wavelength conversion light radiated from the phosphor plate be 570 nm or more and 605 nm or less. In addition, according to this, by combining such a phosphor plate and the light emitting element that emits the blue light, it is possible to obtain a light emitting device that emits the orange light having high luminance.

A configuration of the phosphor plate according to the present embodiment will be described in detail.

(Base Material)

In the composite constituting the phosphor plate described above, the phosphor and an inorganic base material containing the spinel are in a mixed state. Specifically, the composite may have a structure in which the phosphor is dispersed in the sintered material of the compound constituting the inorganic base material. The phosphor may be uniformly dispersed in the inorganic base material containing the spinel in a particle state.

The base material may be a main component in the composite. In this case, a content of the base material may be, for example, 50 Vol % or more in terms of volume with respect to the composite.

The base material is composed of the inorganic base material containing the spinel. The spinel may include spinel represented by a general formula $M_{2x}Al_{4-4x}O_{6-4x}$ (where, M is at least any of Mg, Mn, and Zn, and 0.2<x<0.6).

The spinel is usually obtained by mixing powder of the metal oxide represented by a general formula MO (M is at least any of Mg, Mn, and Zn) and powder of $Al_2O_3$ and sintering the mixture.

Stoichiometrically, the spinel has a composition represented by x=0.5 (that is, a general formula $MAl_2O_4$). Note that, depending on a ratio between an amount of MO and an amount of $Al_2O_3$, which are raw materials, the spinel is a compound having a non-stoichiometric composition in which MO or $Al_2O_3$ is excessively dissolved.

A sintered body containing the spinel represented by the general formula described above is relatively transparent. Therefore, excessive scattering of the light in the phosphor plate is suppressed. From the viewpoint of transparency, it is preferable that M in the general formula described above be Mg.

(Phosphor)

The phosphor according to the present embodiment includes the phosphor containing the Si element.

As the phosphor containing the Si element, a known phosphor can be used, but for example, the α-type sialon phosphor may be used. The sintered material may be used alone or in combination of two or more.

The α-type sialon phosphor may include an α-type sialon phosphor containing an Eu element represented by the following general formula (1).

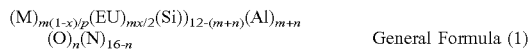
$$(M)_{m(1-x)/p}(EU)_{mx/2}(Si))_{12-(m+n)}(Al)_{m+n}(O)_n(N)_{16-n}$$ General Formula (1)

In the general formula (1) described above, M represents one or more elements selected from the group consisting of Li, Mg, Ca, Y, and a lanthanide element (excluding La and Ce), p represents a valence of an M element, $0<x<0.5$, $1.5 \leq m \leq 4.0$, and $0 \leq n \leq 2.0$. n may be 2.0 or less, 1.0 or less, or 0.8 or less, for example.

In a solid solution composition of the α-type sialon, m Si—N bonds of an α-type silicon nitride unit cell $(Si_{12}N_{16})$ are substituted with Al—N bonds, and n Si—N bonds thereof are substituted with Al—O bonds, m/p cations (M, Eu) are solid-dissolved into a crystal lattice in order to maintain electrical neutrality, and it is represented by the general formula (1) described above. In particular, in a case in which Ca is used as M, the α-type sialon is stabilized in a wide composition range, and the light having a wide wavelength from ultraviolet to blue is excited, and the phosphor showing orange visible emission light can be obtained by substituting a part thereof with Eu which is a center of light emission.

In general, since the α-type sialon has a second crystal phase different from the α-type sialon or an amorphous phase that is inevitably present, the solid solution composition cannot be strictly defined by composition analysis and the like. The α-type sialon may contain, as another crystal phase, β-type sialon, aluminum nitride or its polytypoid, $Ca_2Si_5N_8$, $CaAlSiN_3$, and the like.

As a manufacturing method of the α-type sialon phosphor, there is a method in which mixed powder including a compound of silicon nitride, aluminum nitride, and an infiltrated solid solution element is heated and reacted in a high temperature nitrogen atmosphere. In the α-type sialon phosphor after synthesis, a plurality of equiaxed primary particles are sintered to form massive secondary particles. The primary particles in the present embodiment refer to the smallest particles having the same crystal orientation in the particles and capable of being present independently.

A lower limit of an average particle diameter of the phosphor is preferably 1 μm or more, and more preferably 2 μm or more. As a result, it is possible to enhance the light emission intensity. In addition, an upper limit of the average particle diameter of the phosphor is preferably 30 μm or less, more preferably 20 μm or less. The average particle diameter is a dimension of the phosphor in the secondary particles.

By setting the average particle diameter of the phosphor to 5 μm or more, it is possible to further enhance the transparency of the composite. On the other hand, by setting the average particle diameter of the phosphor to 30 μm or less, it is possible to suppress the occurrence of chipping in a case in which the phosphor plate is cut with a dicer or the like.

Here, the average particle diameter refers to a particle diameter D50 of 50% of a passing amount integration (integrated passing amount ratio) from a small particle diameter side in a volume-based particle diameter distribution obtained by measurement by a laser diffraction/scattering type particle diameter distribution measurement method (LS13-320 manufactured by Beckman Coulter, Inc).

The particle diameter of the phosphor in the phosphor plate may be considered to be substantially the same as the particle diameter of the phosphor used as the raw material. This is because the particle diameter of the raw material phosphor hardly fluctuates due to heating or the like in a plate manufacturing process.

A lower limit value of a content of the phosphor is, for example, 5 Vol % or more, preferably 10 Vol % or more, and more preferably 15 Vol % or more in terms of volume with respect to the entire composite. As a result, it is possible to enhance the light emission intensity in the phosphor plate having a thin layer. In addition, it is possible to improve the light conversion efficiency of the phosphor plate. On the other hand, an upper limit value of the content of the phosphor is, for example, 50 Vol % or less, preferably 45 Vol % or less, and more preferably 40 Vol % or less in terms of volume with respect to the entire composite. It is possible to suppress the decrease in the thermal conductivity of the phosphor plate.

At least a main surface of the phosphor plate described above, or both surfaces of the main surface and a back surface may be subjected to surface treatment. The main surface of the phosphor plate is a surface facing a light emitting surface of the light emitting element.

Examples of the surface treatment include grinding by using a diamond grindstone or the like, and polish such as lapping and polishing.

A surface roughness Ra on the main surface of the phosphor plate described above is, for example, 0.1 μm or more and 2.0 μm or less, and preferably 0.3 μm or more and 1.5 μm or less.

On the other hand, a surface roughness Ra on the back surface of the phosphor plate described above is, for example, 0.1 μm or more and 2.0 μm or less, and preferably 0.3 μm or more and 1.5 μm or less.

By setting the above surface roughness to the above upper limit value or less, it is possible to suppress variations in the light extraction efficiency or the light intensity in an in-plane direction. By setting the above surface roughness to the above lower limit value or more, it is expected that the adhesion to an adherend can be enhanced.

In the phosphor plate described above, an upper limit value of a light transmittance in the blue light of 450 nm is, for example, 10% or less, preferably 5% or less, and more preferably 1.5% or less. As a result, it is possible to suppress the blue light transmitted through the phosphor plate, so that it is possible to emit the orange light with high luminance. By appropriately adjusting the content of the α-type sialon phosphor or the thickness of the phosphor plate, the light transmittance in the blue light of 450 nm can be reduced.

Note that a lower limit value of the light transmittance in the blue light of 450 nm is not particularly limited, but may be, for example, 0.01% or more.

A manufacturing process of the phosphor plate according to the present embodiment will be described in detail.

A manufacturing method of the phosphor plate according to the present embodiment may include a step (1) of obtaining a mixture containing the metal oxide and the phosphor, and a step (2) of firing the obtained mixture.

In addition, in the manufacturing method of the phosphor plate, the metal oxide may be melted, and the particles of the phosphor may be mixed in the obtained melt.

In the step (1), it is preferable that the powder of the phosphor or the metal oxide used as raw materials have high purity as much as possible, and it is preferable that the impurities of elements other than the constituent elements be 0.1% or less.

Various dry and wet methods can be applied to the mixing of the raw material powder, but a method is preferable in which the phosphor particles used as the raw material are not pulverized as much as possible and the impurities from the device are not mixed as much as possible during mixing.

A powdered α-type sialon phosphor is used as an example of the phosphor.

The spinel raw material powder is used as an example of the metal oxide of the raw material.

The metal oxide need only be fine powder, and an average particle diameter thereof may be, for example, 1 µm or less.

The spinel raw material powder may be used as the metal oxide of the raw material.

Here, the "spinel raw material powder" is, for example, (i) powder containing the spinel represented by the general formula $M_{2x}Al_{4-4x}O_{6-4x}$ described above, and/or (ii) a mixture of the powder of the metal oxide represented by the general formula MO (M is at least any of Mg, Mn, and Zn) and the powder of $Al_2O_3$.

In the step (2), the spinel raw material powder may be fired at, for example, 1300° C. or higher and 1650° C. or lower. A heating temperature in a sintering step is more preferably 1500° C. or higher. In order to densify the composite, it is preferable that a firing temperature be high, but in a case in which the firing temperature is too high, the fluorescence intensity of the phosphor plate is decreased, so the range described above is preferable.

In addition, in a case in which the firing temperature is in a high temperature region of about 1600° C. to 1650° C., a maintaining time for maintaining this temperature is, for example, 20 minutes or less, preferably 15 minutes or less, and may be 0 minutes. As a result, it is possible to enhance the light emission intensity of the phosphor plate.

In the manufacturing method described above, a firing method may be normal pressure sintering or pressure sintering, but in order to suppress the decrease in a characteristic of the phosphor and obtain the dense composite, the pressure sintering, which is easier to make the composite denser than the normal pressure sintering, is preferable.

Examples of the pressure sintering method include hot press sintering, spark plasma sintering (SPS), and hot isostatic pressing (HIP). In a case of the hot press sintering or the SPS sintering, the pressure is 10 MPa or more, preferably 30 MPa or more, and preferably 100 MPa or less.

A firing atmosphere is preferably a non-oxidizing inert gas, such as nitrogen or argon, or a vacuum atmosphere for the purpose of preventing the oxidation of the α-sialon.

From the above, the phosphor plate according to the present embodiment is obtained.

The surface of the plate-like composite in the obtained phosphor plate may be subjected to known surface treatment, such as polishing treatment, plasma treatment, or surface coating treatment, in a range in which the effects of the present invention are not impaired.

The light emitting device according to the present embodiment will be described.

The light emitting device according to the present embodiment includes a group III nitride semiconductor light emitting element (light emitting element 20), and a phosphor plate 10 described above provided over one surface of the group III nitride semiconductor light emitting element.

The group III nitride semiconductor light emitting element includes, for example, an n layer, a light emitting layer, and a p layer composed of a group III nitride semiconductor, such as an AlGaN-based, GaN-based, or InAlGaN-based material. As the group III nitride semiconductor light emitting element, a blue LED that emits the blue light can be used.

The phosphor plate 10 may be disposed directly over one surface of the light emitting element 20, but can be disposed through a light transmitting member or a spacer.

As the phosphor plate 10 disposed over the light emitting element 20, a disk-like phosphor plate 100 (phosphor wafer) shown in FIG. 1 may be used, but an individually separated phosphor plate 100 can be used.

A lower limit of the thickness of the phosphor plate 100 shown in FIG. 1 is, for example, 50 µm or more, preferably 80 µm or more, and more preferably 100 µm or more. An upper limit of the thickness of the phosphor plate 100 is, for example, 1 mm or less, preferably 500 µm or less, and more preferably 300 µm or less.

The thickness of the phosphor plate 100 can be appropriately adjusted by grinding or the like after being obtained in the manufacturing process described above.

Note that, since the occurrence of chipping or cracking at the corners is suppressed as compared with a case of a rectangular shape, the disk-like phosphor plate 100 is excellent in the durability and the transportability.

Figure 2A:
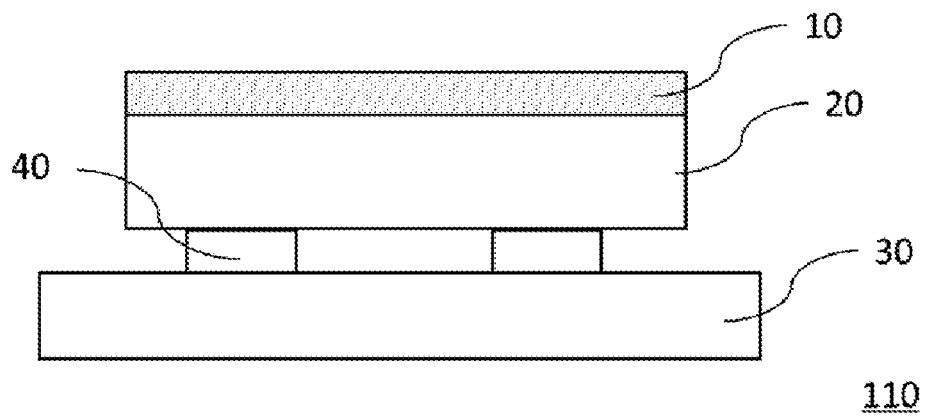
FIG. 2A is a cross-sectional view schematically showing a configuration of a flip-chip type light emitting device.

An example of a semiconductor device described above is shown in FIGS. 2(a) and (b). FIG. 2A is a cross-sectional view schematically showing a configuration of a flip-chip type light emitting device 110, and FIG. 2B is a cross-sectional view schematically showing a configuration of a wire bonding type light emitting device 120.

The light emitting device 110 of FIG. 2A has a substrate 30, a light emitting element 20 electrically connected to the substrate 30 through a solder 40 (die bond material), and the phosphor plate 10 provided over a light emitting surface of the light emitting element 20. The flip-chip type light emitting device 110 may have any one of a face-up type structure and a face-down type structure.

Figure 2B:
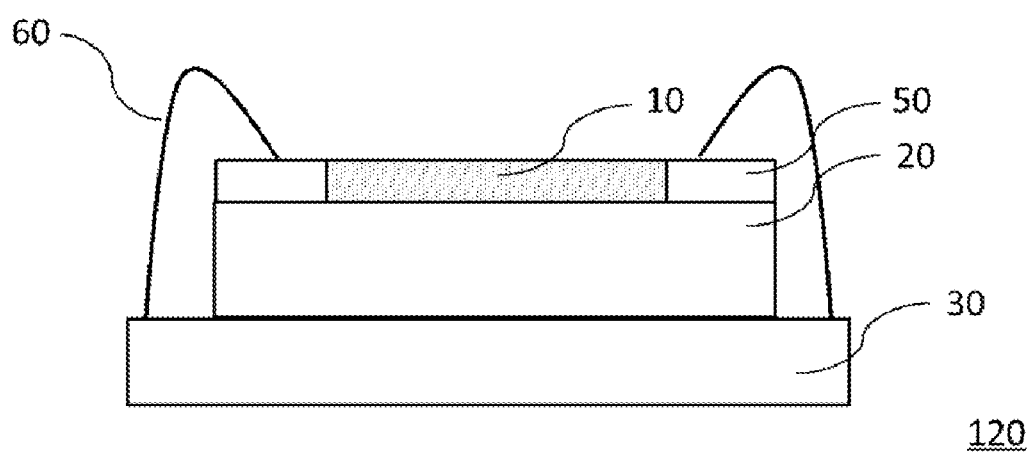
FIG. 2B is a cross-sectional view schematically showing a configuration of a wire bonding type light emitting element.

In addition, the light emitting device 120 of FIG. 2B has the substrate 30, the light emitting element 20 electrically connected to the substrate 30 through a bonding wire 60 and an electrode 50, and the phosphor plate 10 provided over the light emitting surface of the light emitting element 20.

In FIGS. 2A and 2B, the light emitting element 20 and the phosphor plate 10 are attached by a known method, and, for example, may be adhered by a silicone-based adhesive or a heat fusion method.

In addition, the light emitting device 110 and the light emitting device 120 may be entirely sealed with a transparent sealing material.

Note that the individually separated phosphor plate 10 may be attached to the light emitting element 20 mounted on the substrate 30. A plurality of the light emitting elements 20 may be attached to the large-area phosphor plate 100, and then the light emitting elements 20 with the phosphor plate 10 may be individually separated by dicing. In addition, the large-area phosphor plate 100 may be attached to a semiconductor wafer on which the plurality of light emitting elements 20 are formed on a surface thereof, and then the semiconductor wafer and the phosphor plate 100 may be individually separated at a time.

Although the embodiment of the present invention has been described above, the embodiment is an example of the present invention, and various configurations other than the above can be adopted. Note that the present invention is not limited to the embodiment described above, and modifications, improvements, and the like in a range in which the object of the present invention can be achieved are included in the present invention.

EXAMPLES

In the following, the present invention will be described in detail with reference to examples, but the present invention is not limited to the description of these examples.
<Preparation of Phosphor Plate>

Comparative Example 1

A phosphor plate was manufactured by the following procedure.

(1) The α-type sialon phosphor (ALONBRIGHT YL-600B, manufactured by Denka Company Limited, median diameter 15 μm) and the spinel raw material powder (MgO: magnesium oxide manufactured by FUJIFILM Wako Pure Chemical Corporation, average particle diameter 0.2 μm, purity 99.9%, and $Al_2O_3$: AA-03 (manufactured by Sumitomo Chemical Co., Ltd.)) were mixed in ethanol solvent for 30 minutes by using a polyethylene pot and an alumina ball, the obtained slurry was suction-filtered to remove the solvent, and then dried. Then, the mixed raw material was disaggregated through a nylon mesh sieve having an opening of 75 μm to obtain raw material mixed powder.

In a case in which all the spinel raw material powders reacted to form the spinel, an amount of the α-sialon phosphor was adjusted to be 30 Vol % in the phosphor plate (remainder is MgO and $Al_2O_3$).

A ratio of MgO and $Al_2O_3$ in the spinel raw material powder was set to be MgO:$Al_2O_3$=37:63 (Mg:Al=3:4 in molar amount) in terms of mass ratio.

(2) A hot press jig was filled with the raw material mixed powder. Specifically, a carbon die having an inner diameter of 30 mm in which a carbon lower punch was set was filled with about 10 g of the raw material mixed powder. Thereafter, a carbon upper punch was set and the raw material powder was interposed therebetween.

A carbon sheet (GRAFOIL manufactured by GraTech) having a thickness of 0.127 mm was set between the raw material mixed powder and a carbon jig to prevent sticking.

(3) The hot press jig filled with this raw material mixed powder was set in a multipurpose high temperature furnace (manufactured by Fujidempa Kogyo Co., Ltd., Hi multi 5000) including a carbon heater. An inside of the furnace was evacuated to 0.1 Pa or less, and the upper and lower punches were pressurized with a press pressure of 55 MPa while maintaining a reduced pressure state. While maintaining a pressurized state, the temperature was raised to 1600° C. at a rate of 5° C. per minute. Heating was stopped after the temperature reached 1600° C., the temperature was slowly cooled to a room temperature, and the pressure was depressurized. Thereafter, a fired product having an outer diameter of 30 mm was collected, and the main surface, the back surface, and the side surface were ground by using a surface grinding machine and a cylindrical grinding machine. As a result, a disk-shaped phosphor plate having a diameter of 25 mm was obtained (thickness is shown in the table).

Examples 1 to 4

A phosphor plate was obtained in the same manner as in Example 1 except that the ratio of MgO and $Al_2O_3$ in the spinel raw material powder in the above (1) was MgO:$Al_2O_3$=28:72 (Mg:Al=1:2 in the molar amount) in terms of mass ratio in Example 1, was MgO:$Al_2O_3$=24:76 (Mg:Al=9:22 in the molar amount) in terms of mass ratio in Example 2, was MgO:$Al_2O_3$=21:79 (Mg:Al=1:3 in the molar amount) in terms of mass ratio in Example 3, and was MgO:$Al_2O_3$=14:86 (Mg:Al=3:14 in the molar amount) in terms of mass ratio in Example 4.

TABLE 1

| | Plate thickness (mm) | XRD | Maximum peak at 36.0 to 37.4° | Peak included in 32.5 to 34.5° | | | Peak included in 60.2 to 62.0° | | Peak included in 29.0 to 31.0° | | Relative light emission intensity (%) | Light transmittance (455 nm) |
|---|---|---|---|---|---|---|---|---|---|---|---|---|
| Comparative Example 1 | 0.197 | Peak position | 36.88 | 32.78 | | 33.80 | 60.22 | 61.70 | — | | 4 | 23.1% |
| | | Relative intensity | 1 | | 0.931 | | 0.363 | | 0 | | | |
| Example 1 | 0.205 | Peak position | 36.91 | 33.82 | 34.09 | 34.30 | 60.89 | 61.97 | 30.34 | 30.78 | 100 | 1.2% |
| | | Relative intensity | 1 | | 0.238 | | 0.114 | | 0.094 | | | |
| Example 2 | 0.202 | Peak position | 36.91 | 32.94 | | 33.79 | 60.96 | 61.91 | 30.32 | | 105 | 0.4% |
| | | Relative intensity | 1 | | 0.082 | | 0.054 | | 0.137 | | | |
| Example 3 | 0.206 | Peak position | 37.05 | 32.93 | | 33.79 | 60.97 | 61.90 | 30.32 | | 104 | 0.4% |
| | | Relative intensity | 1 | | 0.077 | | 0.048 | | 0.135 | | | |
| Example 4 | 0.213 | Peak position | 37.21 | 32.83 | | 33.77 | 60.94 | 61.89 | 30.30 | | 104 | 0.3% |
| | | Relative intensity | 1 | | 0.094 | | 0.058 | | 0.148 | | | |

The obtained phosphor plates were evaluated based on the evaluation items described below.

[X-Ray Diffraction Pattern]

For the phosphor plate of each Example and each Comparative Example, the diffraction pattern was measured under the following measurement conditions using an X-ray diffraction device (product name: Ultima IV, manufactured by Rigaku Corporation).

(Measurement Conditions)

X-ray source: Cu-Kα ray (λ=1.54184 Å)
Output setting: 40 kV·40 mA
Optical condition at the time of measurement: divergence slit=⅔°
Scattering slit=8 mm
Light receiving slit=open
Position of diffraction peak=2θ (diffraction angle)
Measurement range: 2θ=20° to 70°
Scan speed: 2 degrees (2θ)/sec, continuous scan
Scanning axis: 2θ/θ
Sample preparation: the plate-like phosphor plate was placed on the sample holder.

The peak intensity was a value obtained by performing background correction.

From the obtained X-ray diffraction pattern, it was confirmed that the α-type sialon and the spinel were present as the main phases in any of the phosphor plates.

As a result of the XRD diffraction analysis pattern, the peaks were observed in the phosphor plates of Examples 1 to 4 and Comparative Example 1 in the range of 2θ of 36.0 to 37.4°, in the range of 2θ of 32.5 to 34.5°, and in the range of 2θ of 60.2 to 62.0°. On the other hand, in the range of 2θ of 29.0 to 31.0°, the peaks were observed in Examples 1 to 4, but no peaks were observed in Comparative Example 1.

It was confirmed that the maximum peak having 2θ is in the range of 36.0 to 37.4° corresponded to the spinel.

Table 1 shows the total intensity (relative intensity) of the peaks included in each range and a peak position (°) of the peak included in each range in a case in which the peak intensity corresponding to the maximum peak is 1.

In addition, for SEM observation, the obtained phosphor plate was polished, and the polished surface was observed by the SEM. As a result, in the phosphor plates of Examples 1 to 4, a state in which the α-type sialon phosphor particles were dispersed between the matrix phases containing the spinel was observed.

[Evaluation of Optical Characteristic]

Figure 3:
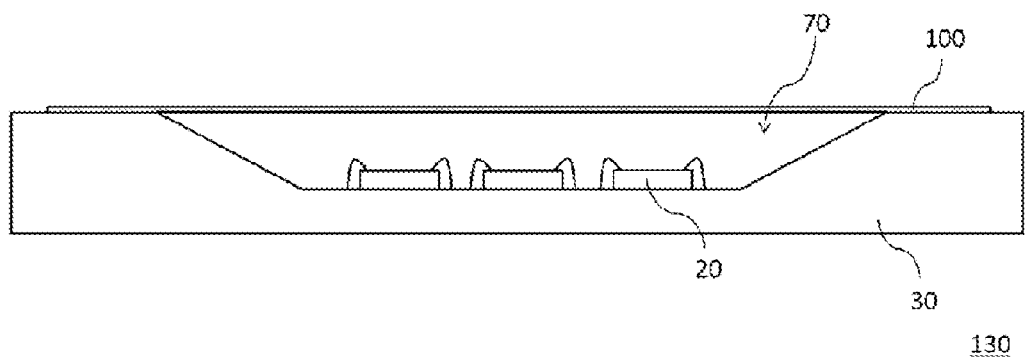
FIG. 3 is a schematic view of a device that measures light emission efficiency of the phosphor plate.

The light emission efficiency of the phosphor plate was evaluated by using a chip-on-board type (COB type) LED package 130. FIG. 3 is a schematic view of a device (LED package 130) that measures the light emission spectrum of the phosphor plate 100.

First, an aluminum substrate (substrate 30) on which a recess 70 was formed was prepared. A diameter φ of a bottom surface of the recess 70 was set to 13.5 mm, and a diameter φ of an opening of the recess 70 was set to 16 mm. The blue LED (light emitting element 20) was mounted as a blue light emitting light source inside the recess 70 of this substrate 30.

Thereafter, the circular phosphor plate 100 is installed above the blue LED so as to close the opening of the recess 70 of the substrate 30 to manufacture the device (chip-on-board type (COB type) LED package 130) shown in FIG. 3.

The light emission spectrum on the surface of the phosphor plate 100 when the blue LED of the manufactured LED package 130 is turned on was measured by using a total luminous flux measurement system (HalfMoon/φ1000 mm integrating sphere system, manufactured by OTSUKA ELECTRONICS CO., LTD).

In the obtained light emission spectrum, a maximum value (W/nm) of the light emission intensity (fluorescence intensity) of the orange light (orange) having a wavelength of 585 nm or more and 605 nm was obtained. Table 1 shows relative values (%) of the other Examples and Comparative Example in a case in which the maximum value of the fluorescence intensity was standardized with Example 1 as 100%.

In addition, the light transmittance (%) of the blue light at a wavelength of 450 nm was obtained from the obtained light emission spectrum. The results are shown in Table 1.

It was shown that the phosphor plates of Examples 1 to 4 showed results that the fluorescence intensity was excellent as compared with those of Comparative Example 1.

This application claims priority based on Japanese Patent Application No. 2020-047298 filed on Mar. 18, 2020, the entire disclosure of which is incorporated herein by reference.

REFERENCE SIGNS LIST

10: phosphor plate
20: light emitting element
30: substrate
40: solder
50: electrode
60: bonding wire
70: recess
100: phosphor plate
100: light emitting device
120: light emitting device
130: LED package

The invention claimed is:

1. A phosphor plate comprising:
   a plate-like composite including a base material and a phosphor contained in the base material,
   wherein the base material contains spinel,
   the phosphor includes a phosphor containing a Si element, and
   in an X-ray diffraction pattern of the phosphor plate measured using a Cu-Kα ray, in a case in which peak intensity corresponding to the spinel having a diffraction angle 2θ in a range of 36.0° or more and 37.4° or less is set to 1, total intensity of peaks having a diffraction angle 2θ in a range of 32.5° or more and 34.5° or less satisfies 0.5 or less.

2. The phosphor plate according to claim 1,
   wherein the phosphor containing the Si element includes an α-type sialon phosphor.

3. The phosphor plate according to claim 2,
   wherein, in the X-ray diffraction pattern of the phosphor plate measured using the Cu-Kα ray, in a case in which the peak intensity attributed to the spinel having the diffraction angle 2θ in the range of 36.0° or more and 37.4° or less is set to 1, total intensity of peaks having a diffraction angle 2θ in a range of 60.2° or more and 62.0° or less satisfies 0.005 or more and 0.2 or less.

4. The phosphor plate according to claim 1,
   wherein, in the X-ray diffraction pattern of the phosphor plate measured using the Cu-Kα ray, in a case in which the peak intensity attributed to the spinel having the diffraction angle 2θ in the range of 36.0° or more and 37.4° or less is set to 1, total intensity of peaks having a diffraction angle 2θ in a range of 29.0° or more and 31.0° or less satisfies 0.01 or more.

5. The phosphor plate according to claim 1,
   wherein the spinel includes spinel represented by a general formula $M_{2x}Al_{4-4x}O_{6-4x}$ (M is at least any of Mg, Mn, and Zn, and 0.2<x<0.6).

6. The phosphor plate according to claim 1,
wherein a content of the phosphor is 5 Vol % or more and 50 Vol % or less in terms of volume in the composite.

7. The phosphor plate according to claim 1,
wherein an average particle diameter D50 of the phosphor is 1 μm or more and 30 μm or less.

8. The phosphor plate according to claim 1,
wherein a thickness of the phosphor plate is 50 μm or more and 1 mm or less.

9. The phosphor plate according to claim 1,
wherein the phosphor plate is used as a wavelength converter that converts radiated blue light into orange light and emits the converted orange light.

10. The phosphor plate according to claim 1,
wherein a light transmittance in blue light of 455 nm is 10% or less.

11. A light emitting device comprising:

a group III nitride semiconductor light emitting element; and the phosphor plate according to claim 1 provided over one surface of the group III nitride semiconductor light emitting element.

\* \* \* \* \*